May 27, 1969 F. G. ALLEN ET AL 3,446,989
MULTIPLE LEVEL LOGIC CIRCUITRY
Filed Aug. 15, 1966 Sheet 1 of 2

INVENTORS
Frihoff Grant Allen
Walter C. Seelbach
BY
Mueller Aichele + Rauner
ATTY'S.

MULTIPLE LEVEL LOGIC CIRCUITRY

Filed Aug. 15, 1966

INVENTORS
Frihoff Grant Allen
Walter C. Seelbach
BY
Mueller, Aichele & Rauner
ATTY'S.

United States Patent Office 3,446,989
Patented May 27, 1969

3,446,989

MULTIPLE LEVEL LOGIC CIRCUITRY

Frihoff Grant Allen, Fort Leonard Wood, Mo., and Walter C. Seelbach, Scottsdale, Ariz., assignors to Motorola, Inc., Chicago, Ill., a corporation of Illinois Filed Aug. 15, 1966, Ser. No. 572,587
Int. Cl. H03k *19/08*
U.S. Cl. 307—208 7 Claims

ABSTRACT OF THE DISCLOSURE

Disclosed are multiple level logic circuits, each including a bistable element having first and second conductive states. The bistable element is adaptive to receive logic signals at first and second input terminals thereof and these logic signals control the conductive state of the bistable element. A plurality of transistor pairs or sets are connected to the first and second input terminals respectively of the bistable element, and the transistor pairs or sets are connected to one or more different levels of enabling and clocking transistors. These enabling or clocking transistors must be biased conductive before the succeeding or next higher level of transistor sets can be biased to conduction. One or more reference transistors is differentially coupled to the enabling and/or clocking transistors, and the enabling and clocking transistors are differentially switched against one or more reference transistors to control the conductive state of the bistable element in accordance with the specific connection of and logic signal input to the above-named transistors. The connection of the above-named transistors to each other and to the bistable element may be widely varied to thus impart substantial logic flexibility to the circuits.

The present invention relates generally to logic circuitry and more particularly to multiple level logic circuitry adapted to give increased logic capability to a single flip-flop.

In application Ser. No. 486,043 of Donald E. Murray, assigned to the assignee of the present application, there is disclosed and claimed a transistor clocking arrangement whereby the state of a bistable flip-flop may be changed upon the application of a predetermined pattern and level of clocking and input switching signals to the flip-flop. The invention to be described herein provides additional novel improvements in multiple level gating over the invention described in the aforementioned Murray application, and these improvements, along with various other advantages and features of the invention, will become apparent from a detailed description of the accompanying drawings.

Accordingly, it is an object of the present invention to provide a multiple level gating circuit for increasing the input logic capability of a single flip-flop.

It is another object of the invention to provide a new and improved multiple level logic circuit for gating a single flip-flop and having low power requirements and very high operational speeds.

It is a further object of the invention to provide a multiple level logic circuit which is easy to construct as a monolithic integrated semiconductor circuit and which is adapted to be coupled to and gated by other known binary logic systems.

A feature of the invention is the provision of a multiple level integrated semiconductor logic circuit connected to and operative to control a bistable element. The logic circuit includes a plurality of emitter coupled transistors which are connected or integrated at different logical levels with respect to the bistable element and which control the conductive state of the bistable element in accordance with complementary binary logic signals applied to the emitter-coupled transistors.

Another feature of this invention is the provision of a plurality of emitter-coupled transistor sets in at least one of the logical levels, and a conductive path is provided from the bistable element to a current sink. One transistor in each set may be connected to a reference potential against which the other transistors in the set switch. The collectors of the transistors in a set are connected to either the common emitters in another transistor set at another level of logic or to the bistable element. Each transistor in a set operates in the common emitter mode, and the transistor in each set to which the highest level of switching potential is applied is turned on and conducts essentially all of the current from the bistable element to the current sink.

These and other objects and features of the invention will become more readily apparent in the following description of the accompanying drawings wherein.

Briefly described, the present invention includes a bistable multivibrator or flip-flop having cross coupled transistors arranged in a symmetrical configuration to receive binary switching signals at first and second input terminals for changing the conductive state of the multivibrator. A first plurality of transistors is connected to the first input terminal of the multivibrator and a second plurality of transistors is connected to a second input terminal of the multivibrator, and each transistor in the first plurality of transistors is joined to a transistor in the second plurality of transistors to form a plurality of emitter-coupled transistor sets. Each transistor set may include any number of emitter-coupled transistors, and any one transistor in a set may be connected to a reference potential against which other transistors in a set switch. A plurality of enabling transistors are connected respectively to the plurality of the emitter-coupled transistor sets in order to enable the conduction of the transistor in a transistor set which receives the highest level of switching or reference potential. This transistor carries essentially all of the current from the multivibrator to a current sink, and the collector of the conducting transistor in a set acts as a current sink for another emitter-coupled transistor or for the bistable multivibrator. If the collector of a transistor in a given set is connected to the first or second input terminals of the flip-flop, switching signals applied to this transistor are capable of changing the state of the flip-flop. If this collector is symmetrically connected as a current sink for the entire flip-flop, switching signals applied to this transistor are capable of maintaining the flip-flop in a fixed state.

The logic capability of the circuit described above may be increased by adding additional clocking transistors between the enabling transistors and the current sink. In this manner the additional clocking transistors may be used to condition the enabling transistors for conduction, thereby adding an additional level of logic between the bistable flip-flop and the current source.

Figures 1, 2:
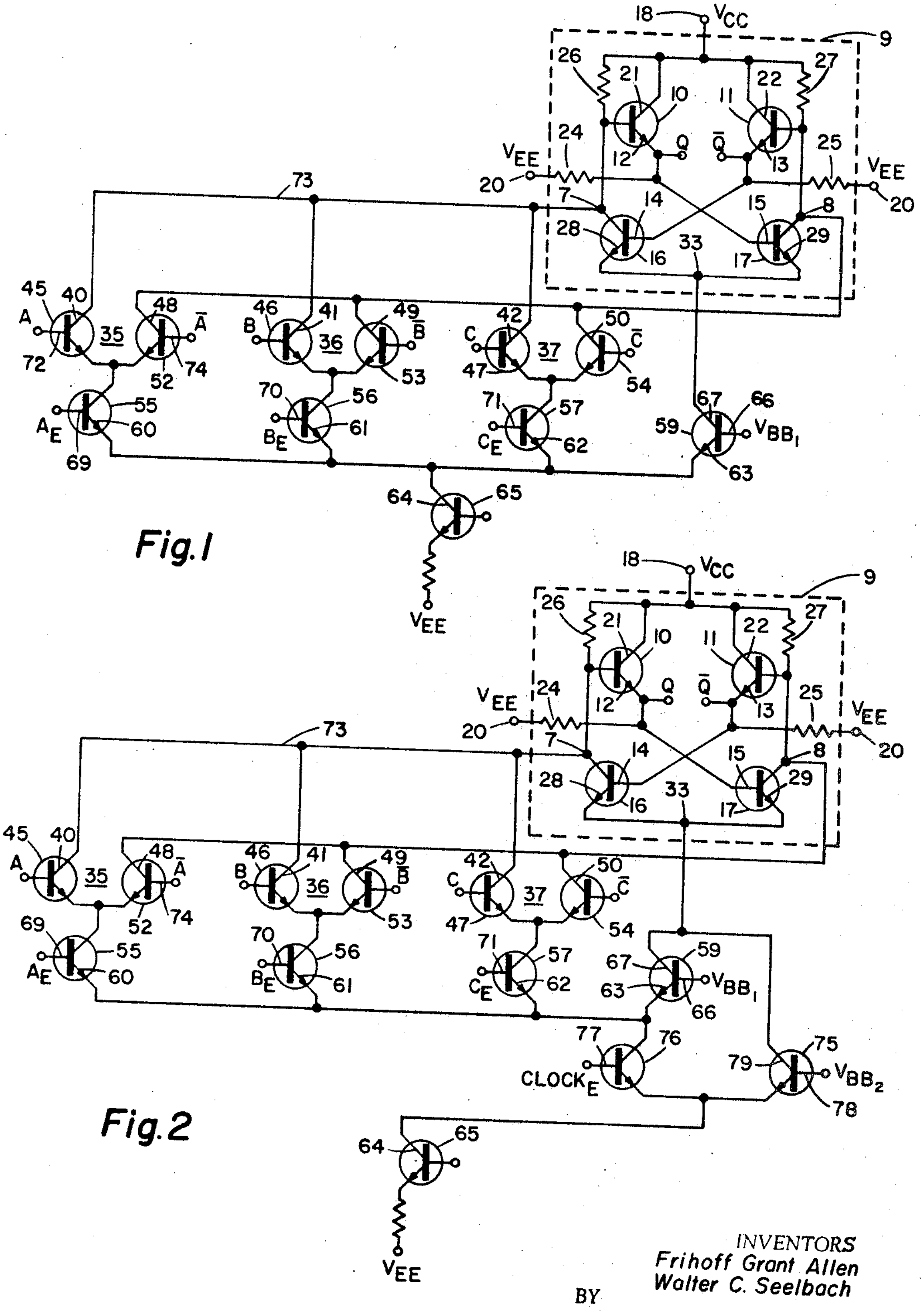
FIG. 1 is a schematic diagram of one embodiment of the invention and includes a bistable flip-flop to which is connected a plurality of emitter-coupled switching and reference transistors.
FIG. 2 is another embodiment of the invention which is similar to FIG. 1 and includes an additional reference transistor and a clocking transistor capable of providing an additional level of gating for the bistable flip-flop.

Referring in detail to the drawings, there is shown in FIG. 1 a bistable element in the form of a cross-coupled bistable multivibrator 9. The multivibrator 9 includes first and second signal output, emitter follower transistors 10 and 11 from which the Q and $\overline{Q}$ outputs are taken at the current output or emitter electrodes 12 and 13 thereof. The emitter electrodes 12 and 13 are directly connected to the bases 14 and 15 of first and second feedback transistors 16 and 17. The collectors or current input electrodes 21 and 22 of transistors 10 and 11 are connected to a source of positive potential $V_{CC}$ at point 18 and the emitter electrodes 12 and 13 of transistors 10 and 11 are resistively coupled via resistors 24 and 25 to a point 20 of negative potential $V_{EE}$. The bistable multivibrator 9 further includes resistors 26 and 27 connected in the base-collector circuits of the signal output transistors 10 and 11, and the emitters or current output electrodes 28 and 29 of feedback transistors 16 and 17 are joined together at a common current output terminal 33.

A plurality of emitter-coupled transistor sets (pairs) 35, 36 and 37 are connected to first and second input terminals 7 and 8 of bistable element 9. The input or collector electrodes 40, 41 and 42 of a first transistor 45, 46 and 47 in each emitter-coupled set is connected to a first input terminal 7 of the flip-flop 9 and the collector electrodes 48, 49 and 50 of a second transistor 52, 53 and 54 in each emitter-coupled transistor set are connected to a second input terminal 8 on the opposite side of the flip-flop 9. Both the first and second transistors in the emitter-coupled transistor sets 35, 36 and 37 are connected as shown to a source of binary logic switching signals referenced as A, $\overline{A}$, B, $\overline{B}$, and C, $\overline{C}$, and each transistor set may be increased by any number transistors, connected in parallel with the transistors 45, 46, 47, 52, 53 or 54.

A plurality of enabling transistors 55, 56 and 57 are connected to the emitter-coupled junctions of the transistor sets 35, 36 and 37, and the emitters 60, 61, 62 and 63 of enabling transistors and a reference transistor 59 are connected to the collector 64 of a current source transistor 65. The reference transistor 59 is connected at its control or base electrode 66 to a reference potential $V_{BB}$, and is connected at the collector electrode 67 to current output terminal 33 in the bistable flip-flop 9.

When there are no enable signals $A_E$, $B_E$ and $C_E$ applied to the control electrodes 69, 70 and 71 of enabling transistors 55, 56 and 57, no current can flow in the emitter-coupled transistor sets 35, 36 and 37. However, when enable signals $A_E$, $B_E$ or $C_E$ are applied to any one of the respective base electrodes 69, 70 and 71 of enabling transistors 55, 56 and 57 and these enable signals are at a level higher than the reference potential $V_{BB}$ applied to the base 66 of transistor 59, the emitter-coupled transistor sets 35, 36 or 37 will be enabled for conduction. When this condition obtains, one of the emitter-coupled transistor sets 35, 36 or 37 will be able to provide a conductive path from flip-flop 9 if a binary logic signal A, B or C of a sufficient magnitude is applied to a particular one of the transistors in the emitter-coupled sets 35, 36 or 37.

Assume for example that no enable signal $A_E$, $B_E$ or $C_E$ is applied to the enabling transistors 55, 56 or 57 respectively, and assume that reference transistor 59 is conducting. Under this quiescent condition of the multivibrator 9, assume also that the second feedback transistor 17 is conducting and that first feedback transistor 16 is nonconducting. Under this condition the first input terminal 7 will be higher at a level of $V_{CC}$, and the voltage at the second input terminal 8 will be equal to the voltage $V_{CC}$ minus the voltage drop across resistor 27. Therefore, the Q output taken from the emitter 12 of transistor 10 will be one diode drop below $V_{CC}$ (a logical one level), and the $\overline{Q}$ output at the emitter 13 of transistor 11 (a logical zero level) will be one diode drop below the voltage at the input terminal 8, $V_{CC}$ minus the voltage drop across resistor 27. Now if at this time, for example, an enable signal $A_E$, which is at a higher level than reference potential $V_{BB}$, is applied at the base electrode 69 of enabling transistor 55, and if a logical ONE is applied as signal A to the base electrode 72 of a first transistor 45 in the emitter-coupled transistor set 35, the current from the flip-flop 9 will be diverted through conductor 73 and through transistors 45 and 55 to the collector 64 of current source transistor 65. This current flow causes the voltage at the first input terminal 7 to be dropped to the value $V_{CC}$ minus the IR drop across resistor 26 and initiates a switching action in the flip-flop 9. This switching action produces a change in the conductive state of the flip-flop 9, and the terminal $\overline{Q}$ rises to a logical ONE level and terminal Q drops to a logical ZERO level.

If, now, the base electrode 72 of transistor 45 drops to a logical ZERO level and the base electrode 74 of transistor 52 rises to a logical ONE level, the state of the flip-flop 9 will again change to the conductive state originally assumed if enable signal $A_E$ is still present at the base 69 of enabling transistor 55 and if no other switching signals affect the conductive state of the flip-flop 9. When the base electrode 74 of transistor 52 falls again to a logical ZERO (and assuming that base 72 remains at logical ZERO), the flip-flop 9 will remain in the state to which it was last switched and current will again flow from the current output terminal 33 into the reference transistor 59 instead of being diverted around feedback transistors 16 and 17.

It should be noted that all that an emitter-coupled transistor pair requires is a differential input, and either a or $\overline{A}$ could be a reference voltage against which the other logic signal switches, For example, the base electrodes of transistors 52, 53 and 54 could all be held at a fixed potential and transistors 45, 46 and 47 could be connected in parallel with a plurality of additional emitter-coupled transistors, each of which is connectable to binary logic signals. The above description of the logic switching of transistor set 35 applies equally as well to emitter-coupled transistor sets 36 and 37, and the three input signal A, $\overline{A}$, $A_E$, B, $\overline{B}$, $B_E$ and C, $\overline{C}$, $C_E$ may be connected to sources of binary logic signals or to reference voltages depending upon the desired switching of flip-flop 9.

The embodiment of FIG. 2 differs from that of FIG. 1 in that a second reference transistor 75 has been connected between the current output terminal 33 of the bistable flip-flop 9 and the emitter-coupled enabling transistors 55, 56 and 57, and a clocking transistor 76 has been added to provide an additional level of logic for the circuit. If a clock signal applied to the base electrode 77 of the clocking transistor 76 is low or at a logical ZERO level, none of the enabling transistors 55, 56 and 57 is capable of enabling the emitter-coupled transistor sets 35, 36 and 37 since there can be no conductive path established between the emitters of enabling transistors 69, 70 and 71 and the current sink transistor 65. Once the clock signal at the base electrode 77 of clocking transistor 76 goes high to a logical ONE level, the enabling transistors 69, 70 and 71 may be driven in conduction by the application of a logical ONE thereto (greater than $V_{BB}$) to enable conduction to take place in the emitter-coupled sets 35, 36 and 37 respectively. However, the logical ONE enable signal which is applied to any of the base electrodes of enabling transistors 69, 70 and 71 and the clock signal which is applied to the base electrode 77 of clocking transistor 76 both must be greater than $V_{BB}$ before any one of the emitter-coupled sets 35, 36 and 37 will be enabled for conduction. If either the clock signal or an enable signal $A_E$, $B_E$ or $C_E$ is less than $V_{BB}$, current will continue to flow into the collector 67 of reference transistor 59 and into the current sink transistor 65.

One important operative feature of the circuit in FIG.

2 is that when a clock signal is present at the base 77 of transistor 76 and when no enabling signals are applied to enabling transistors 55, 56 and 57, the flip-flop 9 will remain in its previous state if a reference voltage $V_{BB}$ is appiled to the first and second reference transistors 59 and 75.

Figures 3, 4:
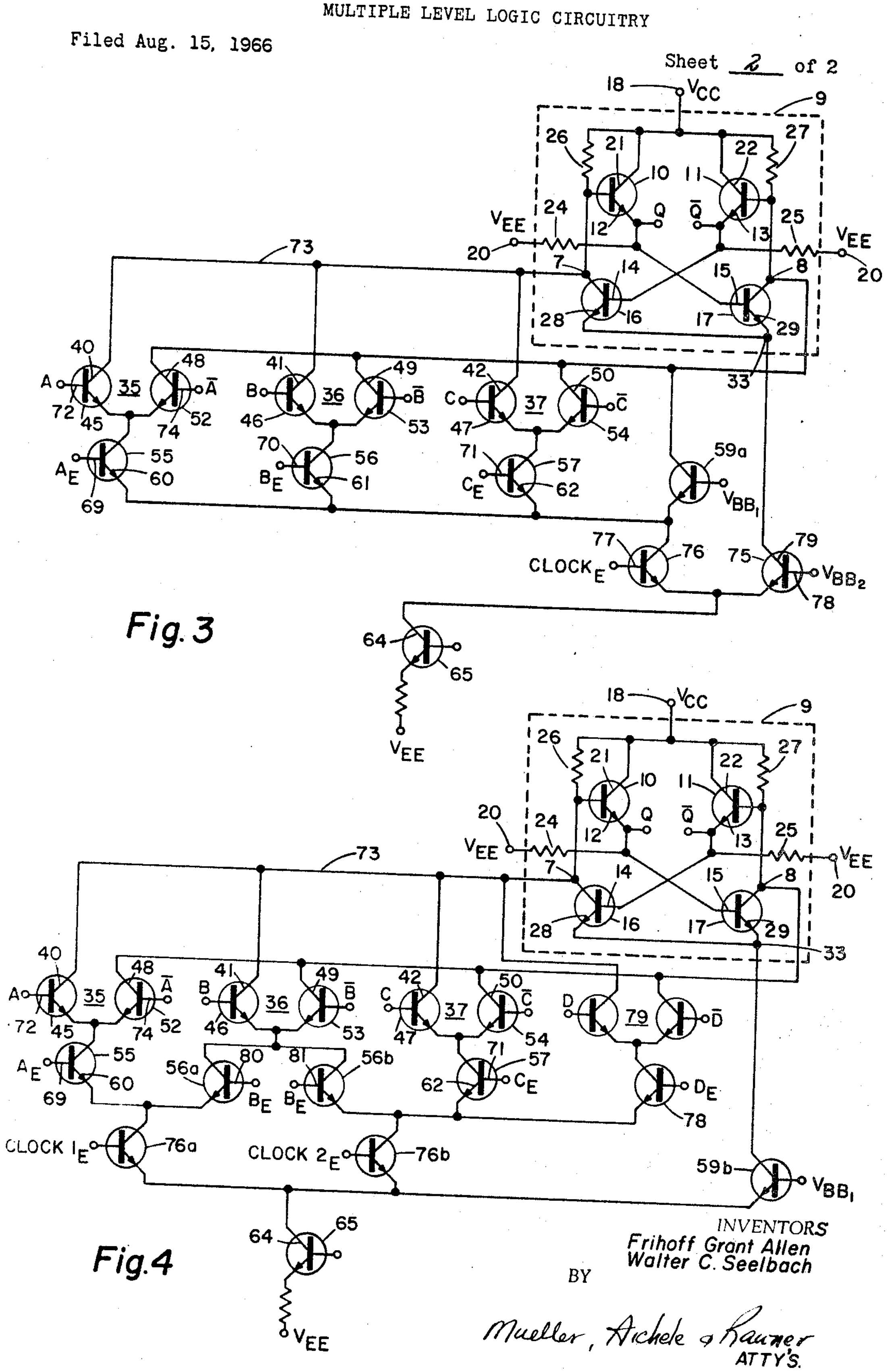
FIG. 3 is another embodiment of the invention, similar to FIGS. 1 and 2, and includes the bistable element which gives a different logic function from that provided by FIG. 2.
FIG. 4 is a further embodiment of the invention which includes additional clocking and enabling transistors in order to further increase the logic capability of the flip-flop.

The circuit of FIG. 3 differs from the circuit of FIG. 2 in that the second reference transistor 75*a* is connected to the second input terminal 8 in the flip-flop 9 rather than the current output terminal 33. The purpose of this connection is to insure that the flip-flop 9 will be set in a known conductive state once the clock signal at the base 77 of clocking transistor 76 goes high and none of the enabling transistors 55, 56 or 57 receive and enable signal $A_E$, $B_E$ or $C_E$, respectively.

It should be emphasized that any level of enables can be explained by adding more transistors on the same switching level and that any circuit can be wired so that one enabling transistor 55, 56 or 57 may be enabled by any one of several switching transistors. For example, the circuit in FIG. 4 uses two clocking transistors 76*a* and 76*b* to control the conductive states of enabling transistors 55, 56*a*, 56*b*, 57 and 78. In the circuit of FIG. 4 the plurality of emitter-coupled transistor sets 35, 36, 37 and 79 can be divided into a first group consisting of transistor sets 35 and 36 and a second group consisting of transistor sets 36, 37 and 79, with emitter-coupled transistor set 36 being common to both the first and the second groups. Clocking transistor 76*a* provides an enabling voltage for enabling transistors 55 and 56*a* while clocking transistor 76*b* provides an enabling voltage for enabling transistors 56*b*, 57 and 78. In the circuit of FIG. 4 the control electrodes 80 and 81 of enabling transistors 56*a* and 56*b* are connected to a common source of enabling voltage so that either clocking transistor 76*a* or clocking transistor 76*b* can control the condition in the emitter-coupled transistor set 36.

We claim:

1. A multiple level logic circuit including, in combination:

(a) a bistable element having first and second conductive states and adapted to receive switching signals at first and second input terminals thereof to change the conductive state of said bistable element, said bistable element further including a current output terminal;

(b) a plurality of transistor sets each including first and second transistors and each transistor in a set having input, output and control electrodes, said first and second transistors connectable to a source of binary logic signals and said first transistor in each pair connected at the input electrode thereof to said first input terminal of said bistable element and said second transistor in each pair connected at the input electrode thereof to said second input terminal of said bistable element, said first and second transistors in each set connected together at the output electrodes thereof;

(c) a plurality of enabling transistors connected respectively to the output electrodes of said first and second transistors constituting said plurality of transistor sets; and (d) a first reference transistor having input, output and control electrodes and DC coupled between said plurality of enabling transistors and said current output terminal of said bistable element, said reference transistor connectable to a source of reference potential and providing a current path from said current output terminal of said bistable element in the absence of conduction in said enabling transistors and said first and second transistors in said transistor sets to which said enabling transistors are connected respectively, said enabling transistors and said transistor sets to which said enabling are connected providing a current path from said first and second input terminals of said bistable element to a current sink during the application of binary logic signals to one of said first and second transistors in each transistor set and during the application of an enable signal to said enabling transistors to which each transistor set is connected of a magnitude greater than said reference potential.

2. The logic circuit according to claim 1 which further includes:

(a) a second reference transistor having input, output and control electrodes, said second reference transistor connected to said current output terminal and further connectable to a second source of reference potential, and (b) a clocking transistor connected to the output electrode of said first reference transistor and differentially connected to said second reference transistor to provide an additional level of logic gating for said bistable element, said clocking transistor connectable to a source of clock signals for conditioning said plurality of enabling transistors to enable said transistor sets to conduct and change the conductive state of the bistable element.

3. The logic circuit according to claim 1 which further includes:

(a) a second reference transistor having input, output and control electrodes, said control electrode of said second reference transistor connectable to a second source of reference potential and connected between said plurality of enabling transistors and one of said first and second input terminals of said bistable element; and (b) a clocking transistor connected to said output electrodes of said first and second reference transistors and connected to said plurality of enabling transistors to provide an additional level of logic gating at said bistable element, said clocking transistor connectable to a source of clock signals for conditioning said plurality of enabling transistors to enable said first and second transistors in each transistor set to which said enabling transistors are connected to conduct and change the state of said bistable element.

4. The logic circuit according to claim 1 which further includes:

(a) first and second clocking transistors, each having input, output and control electrodes, said first and second clocking transistors having the output electrodes thereof connected together and also connected between said plurality of enabling transistors and said first reference transistor;

(b) said first clocking transistor being connected to a first group of enabling transistors in said plurality of enabling transistors and said second clocking transistor being connected to a second group of enabling transistors in said plurality of enabling transistors; and (c) at least one enabling transistor in said first and second groups of enabling transistors being connectable to a common source of enabling voltage thereby providing an enable condition in at least one emitter coupled transistor set upon the application of logic signals from said common source of enabling voltage and upon the application of clocking signals to either of said first or said second clocking transistors.

5. A multiple level logic circuit including, in combination:

(a) bistable multivibrator means having first and second signal output transistors and first and second feedback transistors, said first and second feedback transistors having a common current output terminal, said signal output and feedback transistors cross-coupled in a symmetrical configuration to provide bistable switching action, said multivibrator means having a first input terminal connected to said first signal output transistor and to said first feedback transistor and a second input terminal connected to said second signal output transistor and to said second feedback transistor;

(b) a first plurality of switching transistors connectable to a source of binary logic signals and connected to said first input terminal of said bistable multivibrator means;

(c) a second plurality of switching transistor connectable to a source of binary logic signals and connected to said second terminal of said bistable multivibrator means, each of said transistors in said first plurality of switching transistors being connected to a transistor in said second plurality of switching transistors to form emitter-coupled transistor sets;

(d) a plurality of enabling transistors, each connected respectively to individual ones of said emitter-coupled transistor sets in order to enable at least one transistor in each individual transistor set to conduct during the reception of complementary logic signals at said switching transistors; and (e) a first reference transistor connected to said current output terminal of said multivibrator means and connected between said plurality of enabling transistors and a source of reference potential, said first reference transistor providing a current path from said current output terminal of said bistable multivibrator means to a current sink when enable signals at said enabling transistors are at a level lower than said reference potential to which said first reference transistor is connected.

6. The logic circuit according to claim 5 which further includes:

(a) a second reference transistor having input, output and control electrodes and connected to said source of reference potential, said second reference transistor further connected between said current output terminal of said bistable multivibrator means and said plurality of enabling transistors; and (b) a clocking transistor connected between said first and second reference transistors and connected to said plurality of enabling transistors for conditioning said plurality of enabling transistors for conduction during the application of clock signals to said clocking transistor whereby the application of enable signals to said enabling transistors during the application of clock signals to said clocking transistor enables the individual transistors in said emitter-coupled transistor sets to which said enabling transistors are connected to conduct and change the state of said bistable multivibrator means, said multivibrator means remaining in its previous conductive state when said clock signals and said enable signals are at a lower level than said reference potential to which said first and second reference transistors are connected unless said bistable multivibrator is switched by complementary logic signals applied to certain transistors in said first and second plurality of switching transistors.

7. The circuit according to claim 5 which further includes:

(a) a second reference transistor connected to said source of reference potential and connected between one of said first and second input terminals of said bistable multivibrator means and said plurality of enabling transistors; and (b) a clocking transistor connected to said plurality of enabling transistors and connected between said first and second reference transistors to enable conduction in said second reference transistor upon the application of clock signals to said clocking transistor in order to set said bistable multivibrator means in a fixed state in the absence of enable signals at said enabling transistors at a level higher than said reference potential to which said first and second reference transistors are connected and in the absence of complementary binary logic signals applied to certain transistors in said first and second plurality of switching transistors.

References Cited

UNITED STATES PATENTS

| | | | |
|---|---|---|---|
| 3,114,053 | 12/1963 | Robinson | 307—223 |
| 3,223,853 | 12/1965 | Charbonnier | 307—247 |
| 3,307,047 | 2/1967 | Narud et al. | 307—208 |

ARTHUR GAUSS, *Primary Examiner.*

D. M. CARTER, *Assistant Examiner.*

U.S. Cl. X.R.

307—209, 244, 248, 254, 291